(12) United States Patent
Otsubo et al.

(10) Patent No.: US 11,302,606 B2
(45) Date of Patent: Apr. 12, 2022

(54) HIGH-FREQUENCY MODULE

(71) Applicant: Murata Manufacturing Co., Ltd., Kyoto (JP)

(72) Inventors: Yoshihito Otsubo, Kyoto (JP); Shota Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/999,172

(22) Filed: Aug. 21, 2020

(65) Prior Publication Data
US 2020/0381336 A1 Dec. 3, 2020

Related U.S. Application Data

(63) Continuation of application No. PCT/JP2019/007173, filed on Feb. 26, 2019.

(30) Foreign Application Priority Data

Feb. 28, 2018 (JP) .............................. JP2018-035513

(51) Int. Cl.
*H01L 23/42* (2006.01)
*H01L 23/31* (2006.01)
(Continued)

(52) U.S. Cl.
CPC ............ *H01L 23/42* (2013.01); *H01L 23/315* (2013.01); *H01L 23/3135* (2013.01); *H01L 23/367* (2013.01); *H01L 23/552* (2013.01)

(58) Field of Classification Search
CPC ... H01L 23/42; H01L 23/3135; H01L 23/315; H01L 23/367; H01L 23/552
See application file for complete search history.

(56) References Cited

U.S. PATENT DOCUMENTS 6,114,761 A * 9/2000 Mertol .................. H01L 23/367
257/722
2003/0067746 A1 4/2003 Ishimine
(Continued)

FOREIGN PATENT DOCUMENTS

JP 2003-124663 A 4/2003
JP 2008-034778 A 2/2008
(Continued)

OTHER PUBLICATIONS

Machine English Translation of JP2017028060, Sakai et al., published Feb. 2, 2017.*
(Continued)

*Primary Examiner* — Peniel M Gumedzoe
(74) *Attorney, Agent, or Firm* — Pearne & Gordon LLP

(57) ABSTRACT

A high-frequency module 1a includes: a circuit board 2; a first component 3a, which has characteristics likely to be changed by heat, and a second component 3b, which generates heat, that are mounted on an upper surface 20a of the circuit board 2; a sealing resin layer 4 configured to cover each of the components 3a and 3b and a component 3c; a shield film 5 configured to cover a surface of the sealing resin layer 4; and a heat dissipation member 6 disposed above an upper surface 4a of the sealing resin layer 4. A recessed portion 11 is formed in the upper surface 4a of the sealing resin layer 4 as viewed in a direction perpendicular to the upper surface 20a of the circuit board 2. The recessed portion 11 can prevent the heat generated from the second component 3b from affecting the first component 3a.

20 Claims, 8 Drawing Sheets

(51) Int. Cl.
      *H01L 23/552*     (2006.01)
      *H01L 23/367*     (2006.01)

(56)            References Cited

U.S. PATENT DOCUMENTS

| | | | |
|---|---|---|---|
| 2006/0292741 A1* | 12/2006 | Tseng | H01L 24/97 |
| | | | 438/106 |
| 2009/0091904 A1 | 4/2009 | Hatanaka et al. | |
| 2010/0001410 A1* | 1/2010 | Kang | H01L 23/562 |
| | | | 257/778 |
| 2017/0309571 A1* | 10/2017 | Yi | H01L 24/14 |
| 2018/0033738 A1* | 2/2018 | Kawabata | H01L 24/16 |

FOREIGN PATENT DOCUMENTS

| | | |
|---|---|---|
| JP | 2017-028060 A | 2/2017 |
| JP | 2017-045932 A | 3/2017 |
| JP | 2018-019057 A | 2/2018 |
| JP | 2018-26394 A | 2/2018 |

OTHER PUBLICATIONS

International Search Report for PCT/JP2019/007173 dated May 7, 2019.
Written Opinion for PCT/JP2019/007173 dated May 7, 2019.

* cited by examiner

HIGH-FREQUENCY MODULE

This is a continuation of International Application No. PCT/JP2019/007173 filed on Feb. 26, 2019 which claims priority from Japanese Patent Application No. 2018-035513 filed on Feb. 28, 2018. The contents of these applications are incorporated herein by reference in their entireties.

BACKGROUND OF THE DISCLOSURE

Field of the Disclosure

The present disclosure relates to a module including a substrate on which a component that generates heat is mounted and having a heat dissipation structure.

Description of the Related Art

Regarding a module including a circuit board having a mounting surface on which a component that generates heat is mounted, countermeasures to deal with heat dissipation may be taken to suppress such heat generation from adversely affecting the component. Examples of a module to which such heat dissipation countermeasures are applied include an electronic component module 100 described in Patent Document 1 and illustrated in FIG. 19.

The existing electronic component module 100 illustrated in FIG. 19 includes an electronic component 104 including an integrated circuit 102 that is mounted on a substrate 101 and sealed by a sealing resin 103, an electromagnetic-wave shielding layer 105, and a heat dissipation layer 106. The heat dissipation layer 106 as a heat dissipation structure is disposed, thereby effectively releasing the heat that dissipates during the operation of the electronic component 104 to the outside through the heat dissipation layer 106. Thus, it is possible to prevent, for example, a decline in functions of the electronic component 104.

Patent Document 1: Japanese Unexamined Patent Application Publication No. 2017-45932 (refer to paragraphs 0019 through 0034 and 0042, FIG. 1, and the like)

BRIEF SUMMARY OF THE DISCLOSURE

There is a case in which a plurality of internal components are mounted in the electronic component module 100. For example, when a component that generates heat and another component are mounted in the electronic component module 100, the heat generated from the heat-generating component may be transferred to the other component and may change the characteristics of the other component. In addition, as the height of the electronic component module 100 is reduced, the distance between the heat dissipation layer 106 and the other component decreases. Thus, if a component susceptible to heat is mounted in the electronic component module 100, countermeasures to suppress the effect of heat are necessarily taken for such a component.

The present disclosure has been made in view of the above-described problem and aims to provide a high-frequency module that, while maintaining a heat dissipation structure of a component that generates heat, can suppress heat from affecting another component.

To achieve the above-described aim, a high-frequency module according to the present disclosure includes: a circuit board; a first component and a second component that are mounted on one main surface of the circuit board; a sealing resin layer having a contact surface in contact with the one main surface of the circuit board, a opposite surface opposing to the contact surface, and side surfaces connecting edges of the contact surface to respective edges of the opposite surface, the opposite surface having a recessed portion, the sealing resin layer being configured to seal the first component and the second component; and a heat dissipation member disposed above the opposite surface of the sealing resin layer. The recessed portion is disposed at a position at which the recessed portion overlaps the first component as viewed in a direction perpendicular to the one main surface of the circuit board.

According to such a configuration, due to the recessed portion formed in the opposite surface of the sealing resin layer, a space is created between the first component susceptible to heat and the heat dissipation member. Thus, while the heat generated from the second component that generates heat can dissipate to the outside of the high-frequency module through the heat dissipation member, the heat of the heat dissipation member that has been heated can be suppressed from being transferred to the first component. Therefore, it is possible to suppress heat from affecting the first component.

A first groove deeper than the recessed portion may be formed in the opposite surface of the sealing resin layer, and the first groove may be formed between the first component and the second component and may be connected to the recessed portion.

According to such a configuration, when the first component susceptible to heat and the second component that generates heat are mounted on the one main surface of the circuit board so as to be adjacent to each other, it is possible to suppress the heat generated from the second component from affecting the first component by forming such a groove between the first component and the second component.

A second groove deeper than the recessed portion may be formed in the opposite surface of the sealing resin layer, and the second groove may be formed so as to surround the first component as viewed in the direction perpendicular to the one main surface of the circuit board and may be connected to the recessed portion.

According to such a configuration, the first component susceptible to heat is surrounded by the groove, and it is thereby possible to suppress the first component from being affected by the heat generated from the second component.

The recessed portion may be constituted by a plurality of small depressions formed at a position at which the small depressions overlap the first component as viewed in the direction perpendicular to the one main surface of the circuit board.

According to such a configuration, an area in which the heat dissipation member and the opposite surface of the sealing resin layer are in contact with each other can be increased, and it is thereby possible to suppress heat from affecting the first component while dissipation efficiency is increased.

The recessed portion may be formed to have a shape substantially the same as a shape of the first component as viewed in the direction perpendicular to the one main surface of the circuit board.

In such a case, the recessed portion is formed to have a shape substantially the same as that of the first component susceptible to heat as viewed in the direction perpendicular to the one main surface of the circuit board, and it is thereby possible to further suppress the heat generated from the second component from affecting the first component.

A vent groove may be formed in the opposite surface of the sealing resin layer and may extend from the recessed portion to an end portion of the sealing resin layer as viewed in the direction perpendicular to the one main surface of the circuit board.

According to such a configuration, the vent groove is formed. When the recessed portion formed in the opposite surface of the sealing resin layer is surrounded by the sealing resin layer and the heat dissipation member, air is trapped therein, and the air in the recessed portion may expand due to the heat generated from the second component. However, the vent groove can prevent the high-frequency module from deforming due to the air that has expanded by heat.

The second component may have a height greater than a height of the first component from the one main surface of the circuit board and may be exposed at the opposite surface of the sealing resin layer.

According to such a configuration, the second component that generates heat is exposed at the opposite surface of the sealing resin layer so as to be in contact with the heat dissipation member, and it is thereby possible to increase dissipation efficiency.

A high-frequency module according to the present disclosure may include: a circuit board; a first component and a second component that are mounted on one main surface of the circuit board; a sealing resin layer having a contact surface in contact with the one main surface of the circuit board, a opposite surface opposing to the contact surface, and side surfaces connecting edges of the contact surface to respective edges of the opposite surface, the sealing resin layer including a hollow portion, the sealing resin layer being configured to seal the first component and the second component; and a heat dissipation member disposed above the opposite surface of the sealing resin layer. The hollow portion may be formed to have a height from a surface of the first component on an opposite side to a mounting surface of the first component to a position lower than the opposite surface of the sealing resin layer and may be disposed at a position at which the hollow portion overlaps the first component as viewed in a direction perpendicular to the one main surface of the circuit board.

According to such a configuration, due to the hollow portion formed in the sealing resin layer, it is possible to suppress the heat generated from the second component from affecting the first component. In addition, a heat dissipation structure addressing the need for heat dissipation of the second component can be realized.

The hollow portion may be formed to have a shape substantially the same as a shape of the first component as viewed in the direction perpendicular to the one main surface of the circuit board.

In such a case, the hollow portion formed in the sealing resin layer has a shape substantially the same as that of the first component as viewed in the direction perpendicular to the one main surface of the circuit board, and it is thereby possible to further suppress the heat generated from the second component from affecting the first component.

A high-frequency module according to the present disclosure may include: a circuit board; a first component and a second component that are mounted on one main surface of the circuit board; a sealing resin layer having a contact surface in contact with the one main surface of the circuit board, a opposite surface opposing to the contact surface, and side surfaces connecting edges of the contact surface to respective edges of the opposite surface, the sealing resin layer being configured to seal the first component and the second component; and a heat dissipation member having a facing surface facing the sealing resin layer, the facing surface having a recessed portion. The recessed portion may be disposed at a position at which the recessed portion overlaps the first component as viewed in a direction perpendicular to the one main surface of the circuit board.

According to such a configuration, the recessed portion is formed in the heat dissipation member at a position at which the recessed portion overlaps the first component, and it is thereby possible to suppress the heat dissipation member heated by the heat generated from the second component from affecting the first component.

The recessed portion may be formed to have a shape substantially the same as a shape of the first component as viewed in the direction perpendicular to the one main surface of the circuit board.

In such a case, the recessed portion formed in the heat dissipation member has a shape substantially the same as that of the first component, and it is thereby possible to further suppress the heat generated from the second component from affecting the first component.

A heat dissipation fin may be provided on a surface of the heat dissipation member on an opposite side to the facing surface of the heat dissipation member and may have the recessed portion.

According to such a configuration, a further efficient heat dissipation structure can be formed by providing the heat dissipation fin.

A third groove formed in the opposite surface of the sealing resin layer may further be provided. The third groove may be formed so as to surround the first component as viewed in the direction perpendicular to the one main surface of the circuit board.

According to such a configuration, the groove is formed so as to surround the first component, and it is thereby possible to further suppress heat from affecting the first component.

A shield film configured to cover at least the opposite surface and the side surfaces of the sealing resin layer may be provided.

In such a case, the high-frequency module that suppresses the effect of electromagnetic waves from the outside can be provided.

According to the present disclosure, due to the recessed portion formed in the sealing resin layer at a position corresponding to that of the first component susceptible to heat, the sealing resin layer and the heat dissipation member are not in contact with each other, and it is thereby possible to provide a high-frequency module that, while suppressing heat from affecting the first component, ensures heat dissipation performance of the second component that generates heat. Moreover, due to the hollow portion formed in the sealing resin layer at a position corresponding to that of the first component susceptible to heat, it is possible to provide a high-frequency module that, while suppressing heat from affecting the first component, ensures heat dissipation performance of the second component that generates heat. Furthermore, due to the recessed portion formed in the heat dissipation member at a position corresponding to that of the first component susceptible to heat, it is possible to provide a high-frequency module that, while suppressing heat from affecting the first component, ensures heat dissipation performance of the second component that generates heat.

DETAILED DESCRIPTION OF THE DISCLOSURE

Embodiment 1

Figure 1:
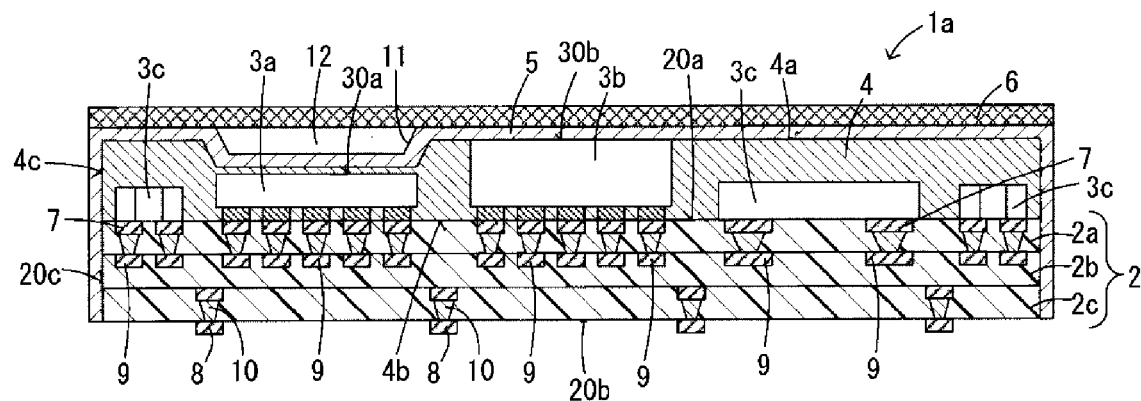
FIG. 1 is a sectional view of a high-frequency module according to Embodiment 1 of the present disclosure.
Figure 2:
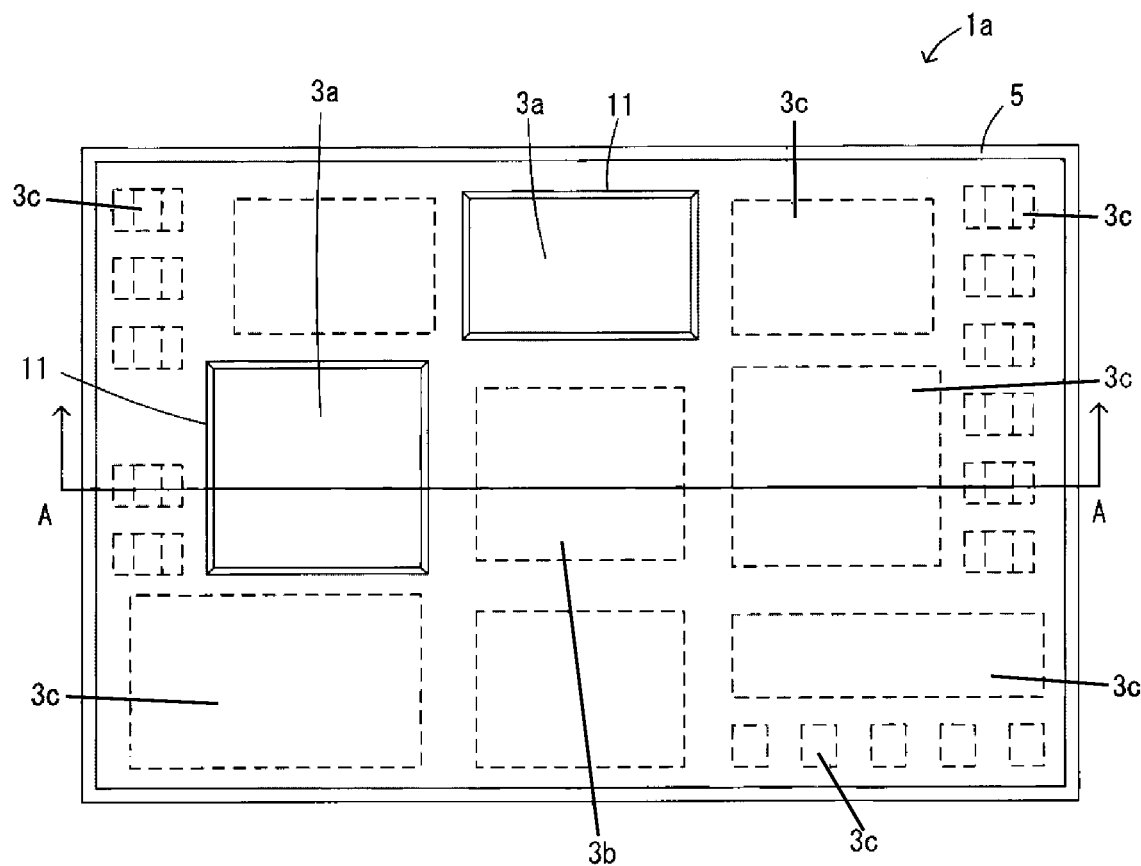
FIG. 2 is a plan view of the high-frequency module in FIG. 1 when a shield film and a heat dissipation member are removed therefrom.

A high-frequency module 1a according to Embodiment 1 of the present disclosure will be described with reference to FIGS. 1 and 2. FIG. 1 is a sectional view taken along line A-A in FIG. 2. FIG. 2 is a plan view of the high-frequency module 1a when a shield film 5 and a heat dissipation member 6 are removed therefrom.

As FIGS. 1 and 2 illustrate, the high-frequency module 1a according to the present embodiment includes: a circuit board 2; a first component 3a, a second component 3b, and a third component 3c that are mounted on an upper surface 20a of the circuit board 2; a sealing resin layer 4 stacked on the upper surface 20a of the circuit board 2; the shield film 5 configured to cover an upper surface 4a of the sealing resin layer 4 (the upper surface 4a corresponds to a "opposite surface of a sealing resin layer" of the present disclosure) and side surfaces 4c; and the heat dissipation member 6 stacked on the shield film 5 of the upper surface 4a of the sealing resin layer 4. The high-frequency module 1a is mounted on, for example, a mother substrate of an electronic device or the like that utilizes high-frequency signals.

The circuit board 2 is, for example, constituted by a plurality of insulating layers 2a to 2c that are made of a material such as low-temperature co-fired ceramic, high-temperature co-fired ceramic, or glass epoxy resin. Mounting electrodes 7 for mounting each of the components 3a to 3c are formed in the upper surface 20a of the circuit board 2, and a plurality of outer electrodes 8 for external connection are formed on a lower surface 20b of the circuit board 2. Inner wiring electrodes 9 and ground electrodes (not illustrated) are formed between the adjacent insulating layers 2a and 2b and between the adjacent insulating layers 2b and 2c. The circuit board 2 includes a plurality of via conductors 10 for connecting the corresponding inner wiring electrodes 9 to each other formed in the different insulating layers 2a, 2b, and 2c. The mounting electrodes 7, the outer electrodes 8, and the inner wiring electrodes 9 are each made of a metal that is typically used for a wiring electrode, such as Cu, Ag, or Al. The via conductors 10 are each made of a metal such as Ag or Cu. Each of the mounting electrodes 7 and the outer electrodes 8 may be plated with Ni/Au.

The first component 3a is a component having characteristics that are likely to be changed by the effect of heat, and examples thereof include components such as an inductor and a capacitor. The second component 3b is a component that generates heat, and examples thereof include components such as an IC and a power amplifier. The third component 3c is a component other than the first component 3a and the second component 3b. The components 3a to 3c are each mounted on the upper surface 20a of the circuit board 2 by using a known surface mount technology such as solder bonding. An upper surface 30b of the second component 3b is exposed at the upper surface 4a of the sealing resin layer 4 and connected to the shield film 5.

The sealing resin layer 4 is made of a resin that is typically used as a sealing resin, such as an epoxy resin, and seals each of the components 3a to 3c. The sealing resin layer 4 has a lower surface 4b in contact with the circuit board 2 (the lower surface 4b corresponds to a "contact surface of the sealing resin layer" of the present disclosure), the upper surface 4a opposite from the lower surface 4b (the upper surface 4a corresponds to the "opposite surface of the sealing resin layer" of the present disclosure), and the side surfaces 4c. A recessed portion 11 is formed in the upper surface 4a of the sealing resin layer 4. As FIG. 2 illustrates, as viewed in a direction perpendicular to the upper surface 20a of the circuit board 2, the recessed portion 11 is formed at a position at which the recessed portion 11 overlaps the first component 3a and formed so as to have a shape substantially the same as that of the first component 3a. The recessed portion 11 may be larger than the first component 3a.

The shield film 5 covers surfaces of the sealing resin layer 4 (the upper surface 4a and the side surfaces 4c) and side surfaces 20c of the circuit board 2. The shield film 5 is connected to the ground electrodes (not illustrated) exposed at the corresponding side surface 20c of the circuit board 2.

The shield film 5 can be formed so as to have a multilayer structure including a close-contact film that is laminated on the upper surface 4a and the side surfaces 4c of the sealing resin layer 4, a conductive film that is laminated on the close-contact film, and a protective film that is laminated on the conductive film. Here, the close-contact film is provided to increase the adhesive strength between the conductive film and the sealing resin layer 4 and can be made of a metal such as SUS. The conductive film is a layer having a substantial shielding function of the shield film 5 and can be made of, for example, any one of the metals of Cu, Ag, and A1. The protective film is provided to prevent the conductive film from being corroded and damaged and can be made of, for example, SUS.

The heat dissipation member 6 is a plate-shaped metal disposed above the upper surface 4a of the sealing resin layer 4. Due to such disposition of the heat dissipation member 6, the heat generated from the second component 3b is enabled to dissipate to the outside of the high-frequency module 1a. In the present embodiment, because the shield film 5 is formed so as to cover the upper surface 4a and the side surfaces 4c of the sealing resin layer 4, the heat dissipation member 6 is mounted on the shield film 5.

Here, in the present embodiment, due to the recessed portion 11 formed in the upper surface 4a of the sealing resin layer 4, a hollow portion 12 is formed between the heat dissipation member 6 and the first component 3a. Thus, even if the heat dissipation member 6 generates heat due to the heat generated from the second component 3b, it is possible to prevent the heat from being transferred from the upper surface 4a of the sealing resin layer to the first component 3a.

Therefore, according to the above-described embodiment, the recessed portion 11 is formed between the first component 3a and the heat dissipation member 6, and it is thereby possible to prevent the heat generated from the second component 3b from affecting the first component 3a via the heat dissipation member 6. In such a case, the heat dissipation member 6 covers the entire upper surface 4a of the sealing resin layer 4, and it is thereby possible to suppress heat from affecting the first component 3a without decreasing dissipation efficiency of the second component 3b.

(Modification 1 of Recessed Portion)

Figure 3:
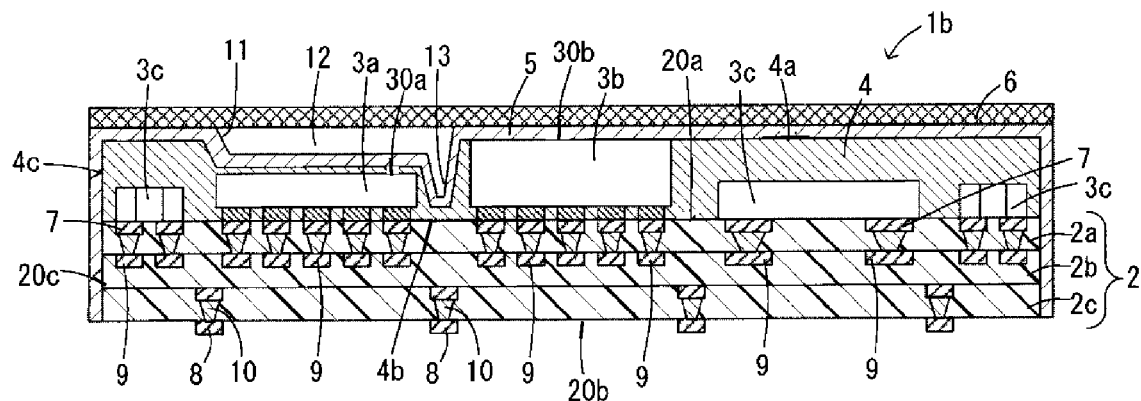
FIG. 3 illustrates a modification of the high-frequency module in FIG. 1.

As with a high-frequency module 1b illustrated in FIG. 3, a first groove 13 that continues from the recessed portion 11 may be formed in the upper surface 4a of the sealing resin layer 4. The hollow portion 12 extends even to a region between the first component 3a and the second component 3b by forming the first groove 13. Thus, it is possible to prevent the first component 3a from being affected by heat through a side surface thereof.

(Modification 2 of Recessed Portion)

Figure 4:
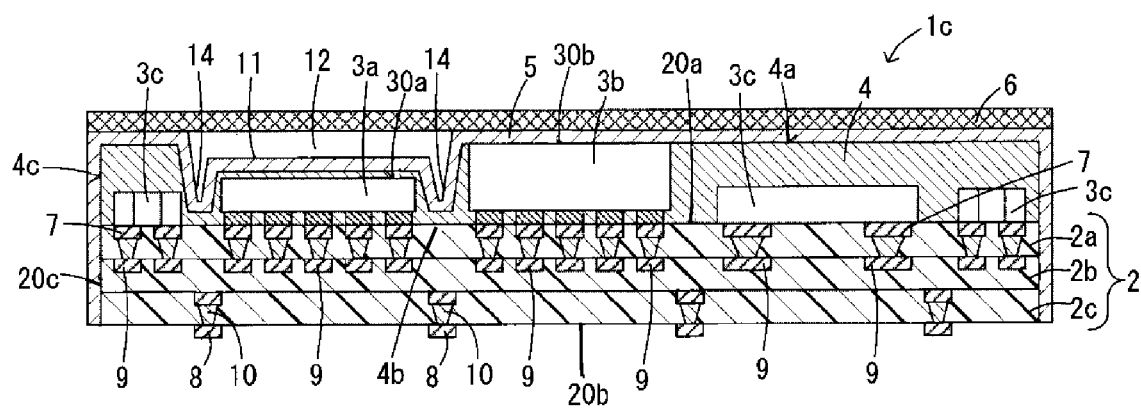
FIG. 4 illustrates a modification of the high-frequency module in FIG. 1.

As with a high-frequency module 1c illustrated in FIG. 4, a second groove 14 may be formed so as to surround the first component 3a. In such a case, it is possible to further suppress the first component 3a from being affected by heat.

(Modification 3 of Recessed Portion)

Figure 5:
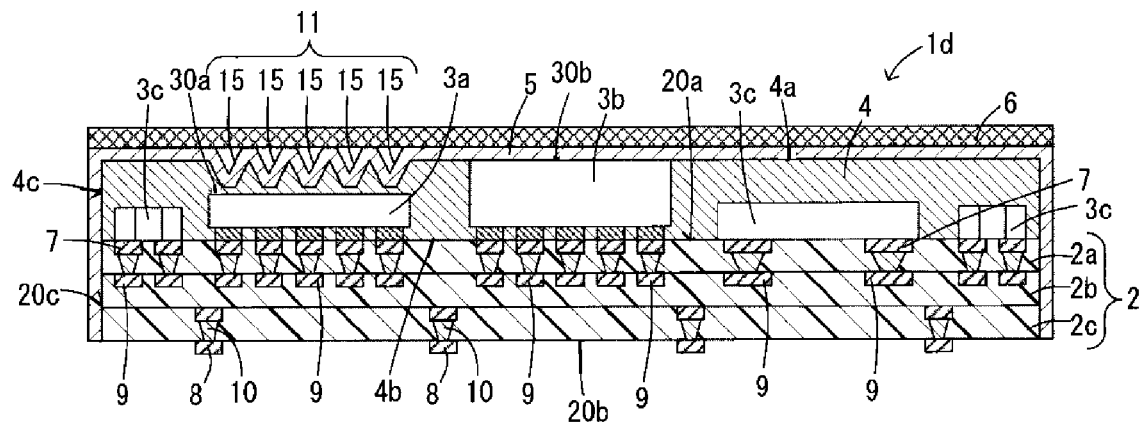
FIG. 5 illustrates a modification of the high-frequency module in FIG. 1.

As with a high-frequency module 1d illustrated in FIG. 5, the recessed portion 11 may be constituted by a plurality of small recessed portions 15 (corresponding to "small depressions" of the present disclosure). In such a case, the area in which the heat dissipation member 6 and the sealing resin layer 4 are in contact with each other increases, and it is thereby possible to further increase dissipation efficiency.

Embodiment 2

Figure 6:
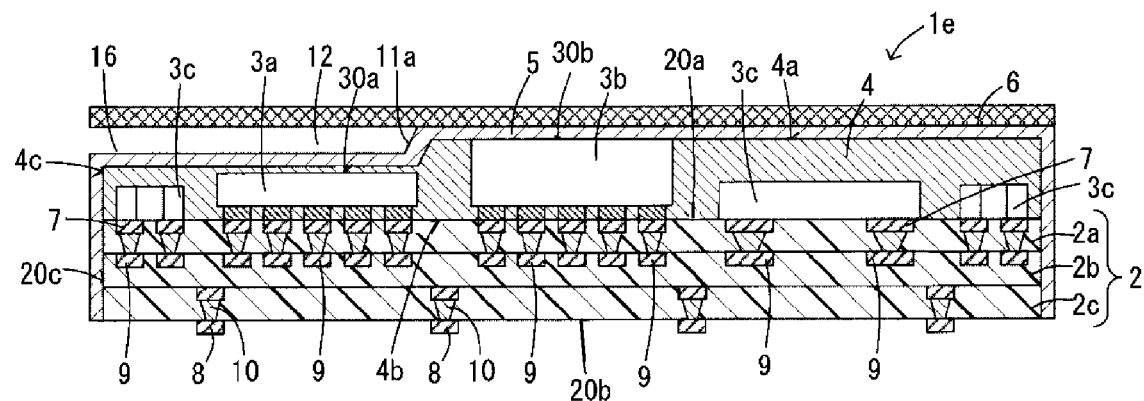
FIG. 6 is a sectional view of a high-frequency module according to Embodiment 2 of the present disclosure.
Figure 7:
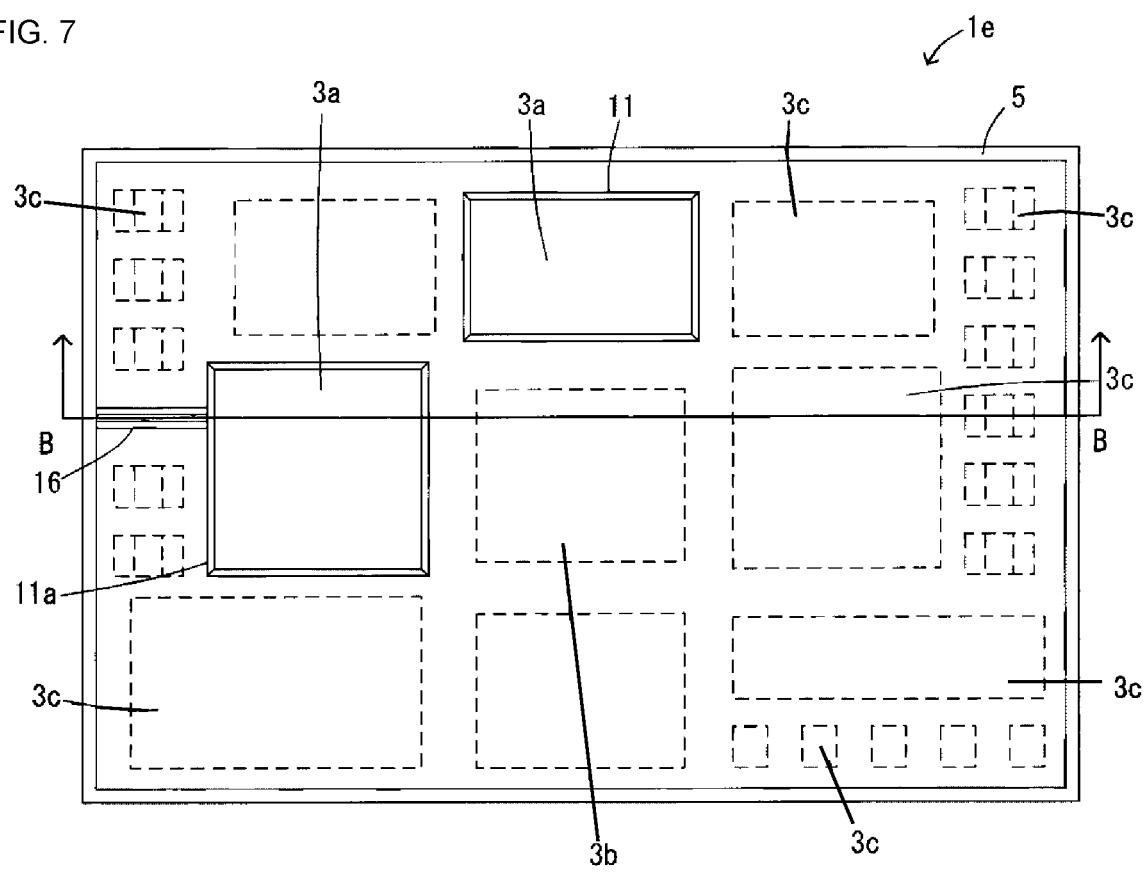
FIG. 7 is a plan view of the high-frequency module in FIG. 6 when a shield film and a heat dissipation member are removed therefrom.

A high-frequency module 1e according to Embodiment 2 of the present disclosure will be described with reference to FIGS. 6 and 7. FIG. 6 is a sectional view taken along line B-B in FIG. 7. FIG. 7 is a plan view of the high-frequency module 1e when the shield film 5 and the heat dissipation member 6 are removed therefrom.

The high-frequency module 1e according to the present embodiment differs from the high-frequency module 1a of Embodiment 1 described with reference to FIGS. 1 and 2 in that a vent groove 16 is formed from the recessed portion 11 toward one of the side surfaces 4c of the sealing resin layer 4 as FIGS. 6 and 7 illustrate. Other constituents are the same as those of the high-frequency module 1a of Embodiment 1, and the description of such constituents is omitted by being denoted by the same references.

In the present embodiment, the vent groove 16 is formed from a recessed portion 11a that is one of the recessed portions formed in the upper surface 4a of the sealing resin layer 4 toward one of the side surfaces 4c of the sealing resin layer 4. By forming the vent groove 16, air can be vented to the outside from the hollow portion 12 surrounded by the recessed portion 11a and the heat dissipation member 6.

According to such a configuration, in addition to advantageous effects similar to those of the high-frequency module 1a of Embodiment 1, it is possible to prevent the high-frequency module 1d from deforming by the air trapped in the hollow portion 12 expanding due to heat.

Embodiment 3

Figure 8:
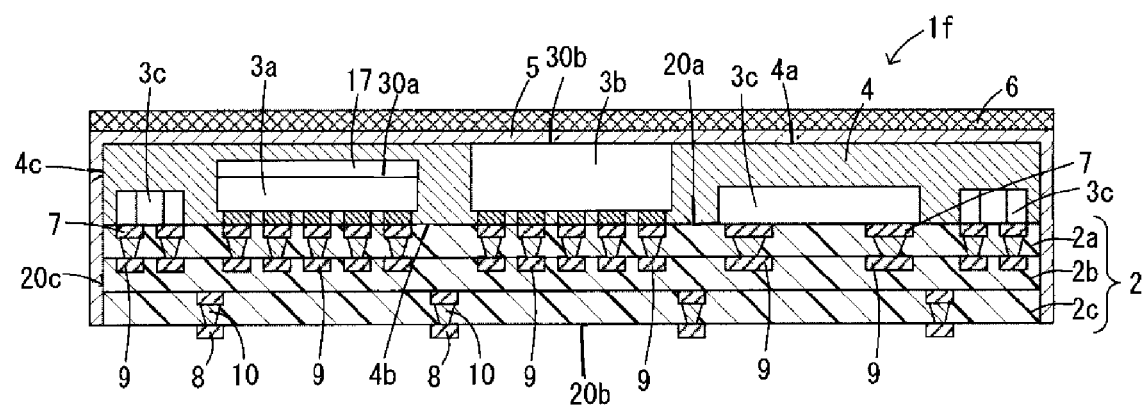
FIG. 8 is a sectional view of a high-frequency module according to Embodiment 3 of the present disclosure.

A high-frequency module 1f according to Embodiment 3 of the present disclosure will be described with reference to FIG. 8. FIG. 8 is a sectional view of the high-frequency module 1f.

The high-frequency module 1f according to the present embodiment differs from the high-frequency module 1a of Embodiment 1 described with reference to FIGS. 1 and 2 in that a hollow portion 17 is formed in the sealing resin layer 4 as FIG. 8 illustrates. Other constituents are the same as those of the high-frequency module 1a of Embodiment 1, and the description of such constituents is omitted by being denoted by the same references.

In the present embodiment, as viewed in the direction perpendicular to the upper surface 20a of the circuit board 2, the hollow portion 17 is formed at a position at which the hollow portion 17 overlaps the first component 3a. The hollow portion 17 can be formed by stacking the sealing resin layer 4 after wax is applied to the upper surface 30a of the first component 3a (the upper surface 30a corresponds to a "surface of a first component on an opposite side" of the present disclosure). This is because the wax is melted by the heat that is used when the sealing resin layer 4 is cured and the hollow portion 17 is then formed.

According to such a configuration, the upper surface 30a of the first component 3a is not in contact with the sealing resin layer 4, and it is thereby possible to further suppress heat from affecting the first component 3a.

Embodiment 4

Figure 9:
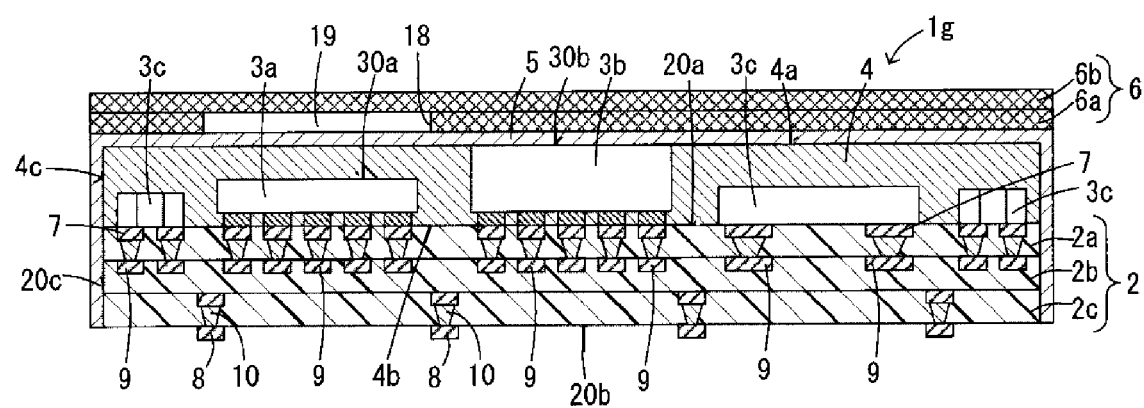
FIG. 9 is a sectional view of a high-frequency module according to Embodiment 4 of the present disclosure.
Figure 10:
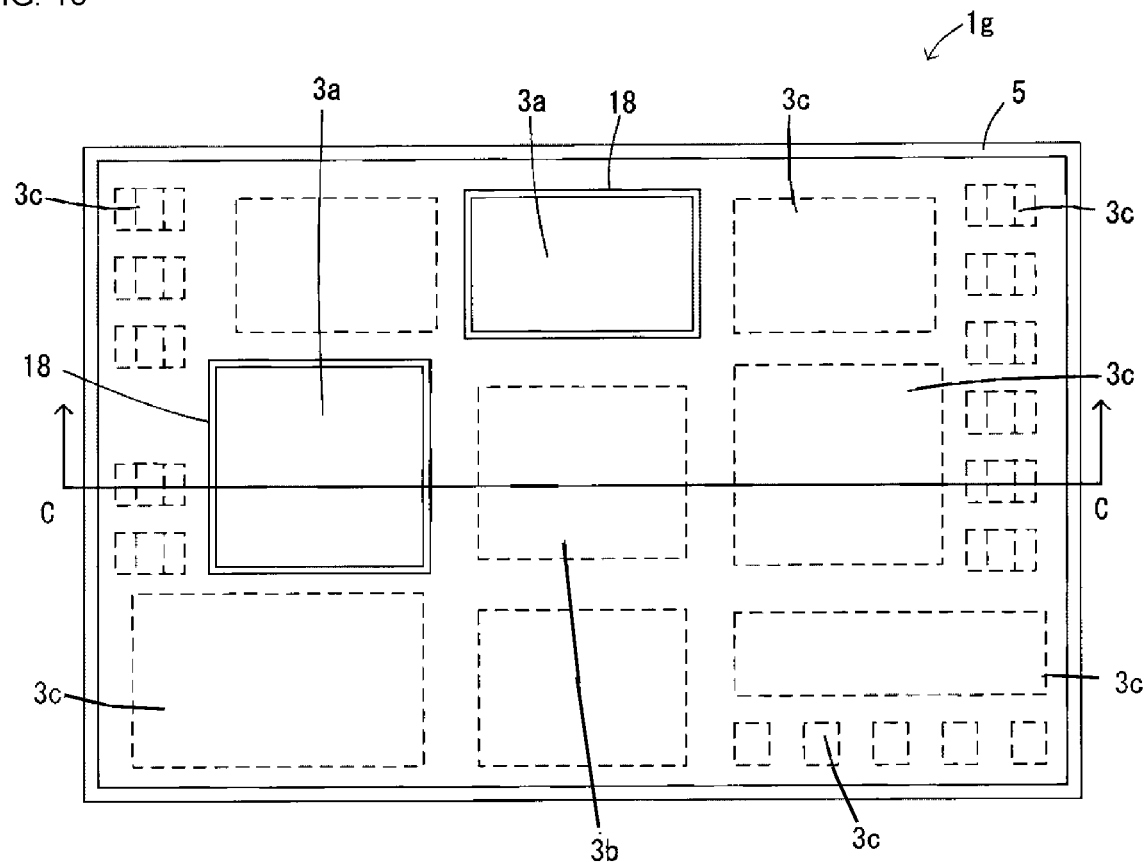
FIG. 10 is a plan view of the high-frequency module in FIG. 9 when a portion of a heat dissipation member is removed therefrom.

A high-frequency module 1g according to Embodiment 4 of the present disclosure will be described with reference to FIGS. 9 and 10. FIG. 9 is a sectional view taken along line C-C in FIG. 10. FIG. 10 is a plan view of the high-frequency module 1g when a portion of the heat dissipation member 6 is removed therefrom.

The high-frequency module 1g according to the present embodiment differs from the high-frequency module 1a of Embodiment 1 described with reference to FIGS. 1 and 2 in that a recessed portion is formed in the heat dissipation member 6 as opposed to being formed in the sealing resin layer 4 as FIGS. 9 and 10 illustrate. Other constituents are the same as those of the high-frequency module 1a of Embodiment 1, and the description of such constituents is omitted by being denoted by the same references.

In the present embodiment, the heat dissipation member 6 has a two-layer structure including a lower layer 6a and an upper layer 6b. As FIG. 10 illustrates, as viewed in the direction perpendicular to the upper surface 20a of the circuit board 2, a hole 18 having a shape substantially the same as that of the first component 3a is formed in the lower layer 6a of the heat dissipation member 6 at a position at which the hole 18 overlaps the first component 3a. The upper layer 6b of the heat dissipation member 6 is stacked on the lower layer 6a of the heat dissipation member 6 having the hole 18, and a recessed portion 19 is thereby provided in the heat dissipation member 6.

According to such a configuration, in addition to advantageous effects similar to those of the high-frequency module 1a of Embodiment 1, it is possible to further increase dissipation efficiency because the heat dissipation member 6 has the two-layer structure.

(Modification 1 of Heat Dissipation Member)

Figure 11:
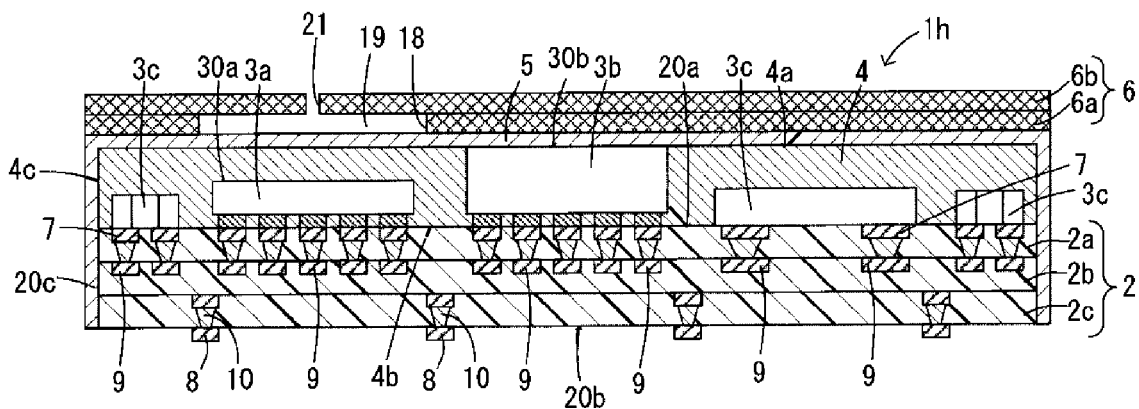
FIG. 11 illustrates a modification of the high-frequency module in FIG. 9.

As with a high-frequency module 1h illustrated in FIG. 11, an air hole 21 may be formed in the upper layer 6b of the heat dissipation member 6. The air hole 21 is provided at a position at which the air hole 21 overlaps the hole 18 formed in the lower layer 6a of the heat dissipation member 6 as viewed in the direction perpendicular to the upper surface 20a of the circuit board 2. Thus, the air trapped in the recessed portion 19 of the heat dissipation member 6 can be released to the outside, and it is thereby possible to prevent the high-frequency module 1h from deforming by such air expanding due to heat.

(Modification 2 of Heat Dissipation Member)

Figure 12:
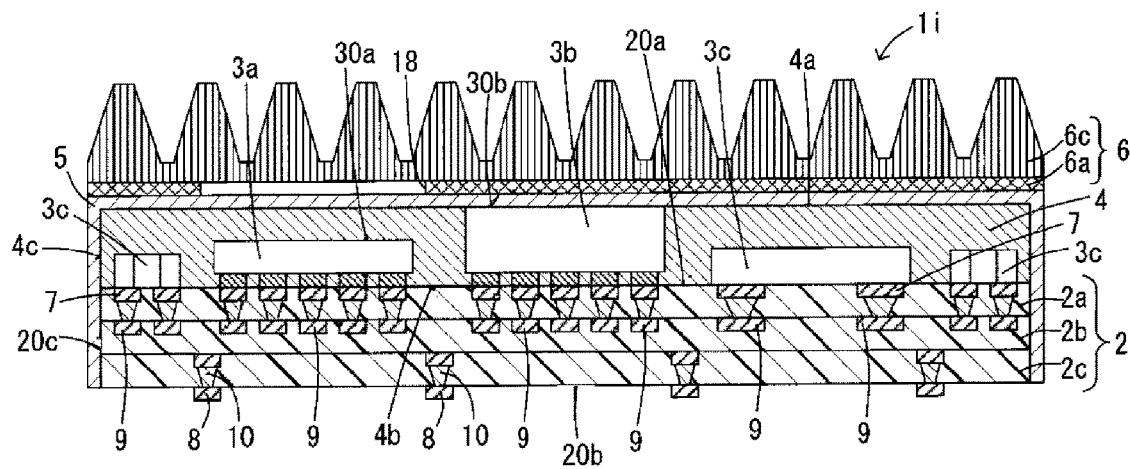
FIG. 12 illustrates a modification of the high-frequency module in FIG. 9.
Figure 13:
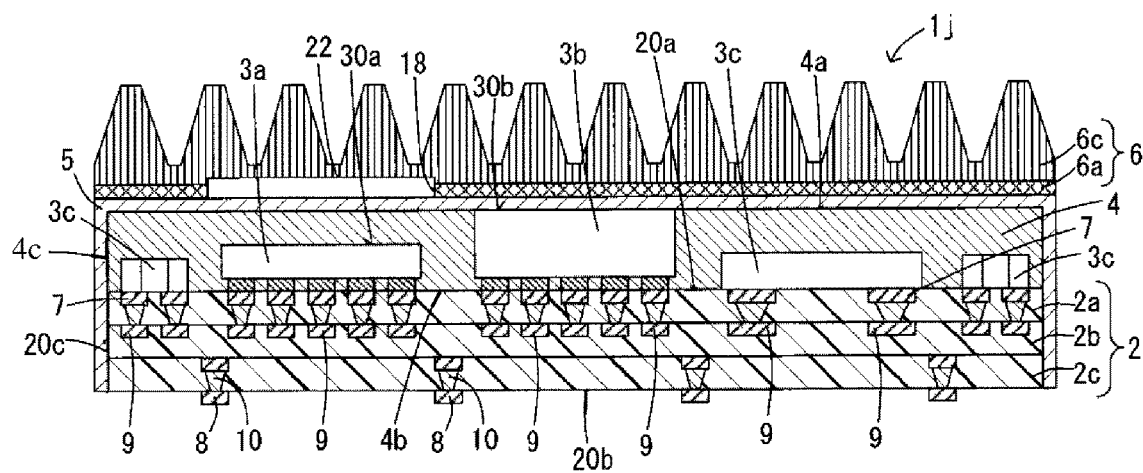
FIG. 13 illustrates a modification of the high-frequency module in FIG. 9.

As with a high-frequency module 1i illustrated in FIG. 12, the upper layer of the heat dissipation member 6 may be a heat dissipation fin 6c. In such a case, it is possible to further increase dissipation efficiency. In addition, as with a high-frequency module 1j illustrated in FIG. 13, a recessed portion 22 may be formed in the heat dissipation fin 6c. The recessed portion 22 is formed at a position at which the recessed portion 22 overlaps the first component 3a as viewed in the direction perpendicular to the upper surface 20a of the circuit board 2. In such a case, the heat dissipation member 6 may be constituted by only the heat dissipation fin 6c.

(Modification of Sealing Resin Layer)

Figure 14:
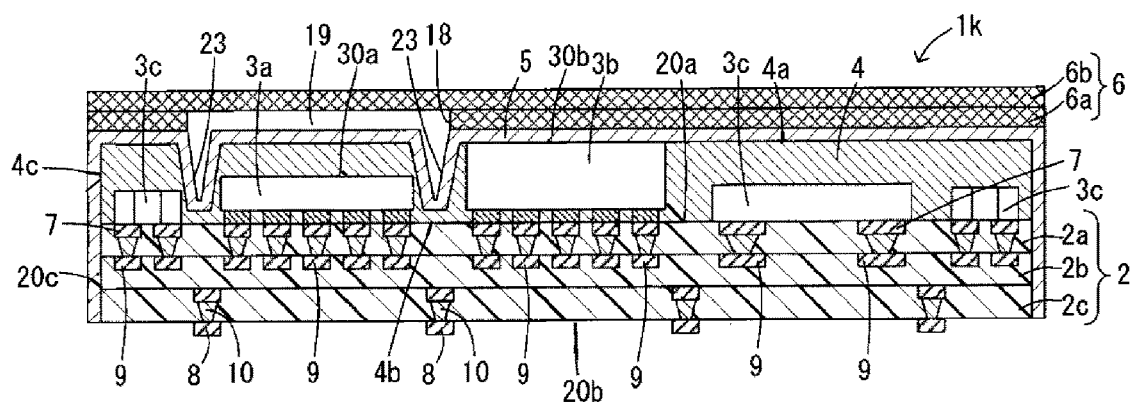
FIG. 14 illustrates a modification of the high-frequency module in FIG. 9.
Figure 15:
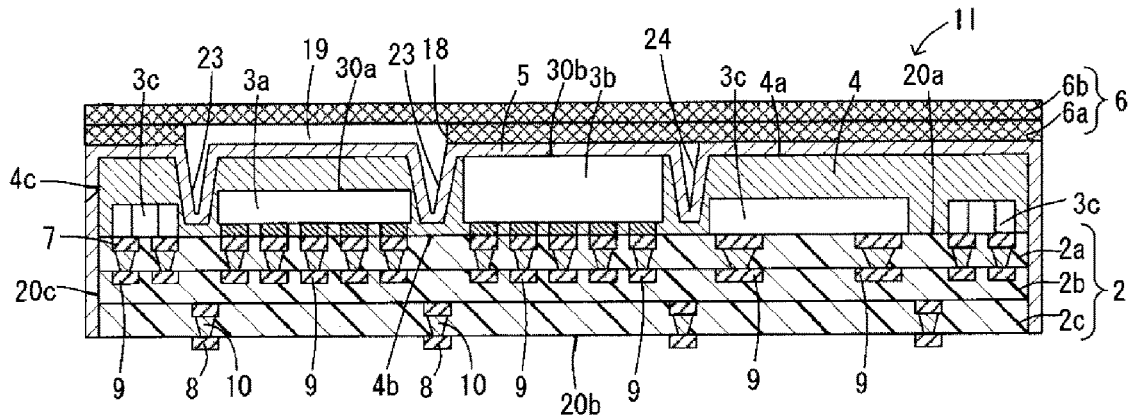
FIG. 15 illustrates a modification of the high-frequency module in FIG. 9.

As with a module 1k illustrated in FIG. 14, the recessed portion 19 may be formed in the heat dissipation member 6, and, in the sealing resin layer 4, a third groove 23 may further be formed around the first component 3a. It is possible to further suppress heat from affecting the first component 3a by forming the third groove 23. In addition, as with a high-frequency module 1l illustrated in FIG. 15, a fourth groove 24 may further be formed around the second component 3b. The second component 3b that generates heat is surrounded by the fourth groove 24, and it is thereby possible to prevent other components from being affected by the heat generated from the second component 3b.

Embodiment 5

Figure 16:
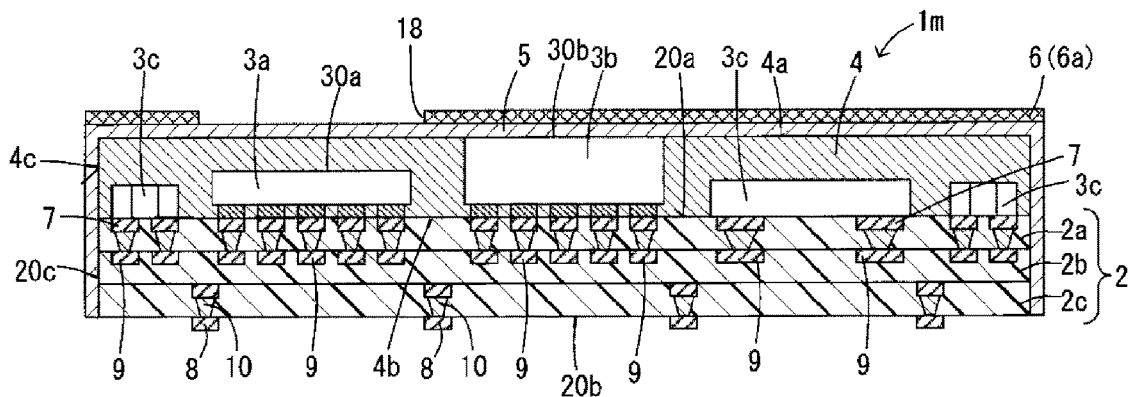
FIG. 16 is a sectional view of a high-frequency module according to Embodiment 5 of the present disclosure.

A high-frequency module 1m according to Embodiment 5 of the present disclosure will be described with reference to FIG. 16. FIG. 16 is a sectional view of the high-frequency module 1m.

The high-frequency module 1m according to the present embodiment differs from the high-frequency module 1g of Embodiment 4 described with reference to FIGS. 9 and 10 in that the heat dissipation member 6 is constituted by only the lower layer 6a as FIG. 16 illustrates. Other constituents are the same as those of the high-frequency module 1a of Embodiment 1, and the description of such constituents is omitted by being denoted by the same references.

In the present embodiment, the heat dissipation member 6 is constituted by only the lower layer 6a, and the heat dissipation member 6, which has the hole 18 formed at a position at which the hole 18 overlaps the first component 3a as viewed in the direction perpendicular to the upper surface 20a of the circuit board 2, is disposed on the upper surface 4a of the sealing resin layer 4.

According to such a configuration, the hole 18 is formed at only a position at which the hole 18 overlaps the first component 3a, and it is thereby possible to prevent the first component 3a from being affected by the heat generated from the second component 3b. The heat dissipation member 6 is disposed in a region other than the position at which the hole 18 overlaps the first component 3a, and it is thereby possible to suppress the effect on the first component 3a without decreasing dissipation efficiency.

(Modification of Heat Dissipation Member)

Figure 17:
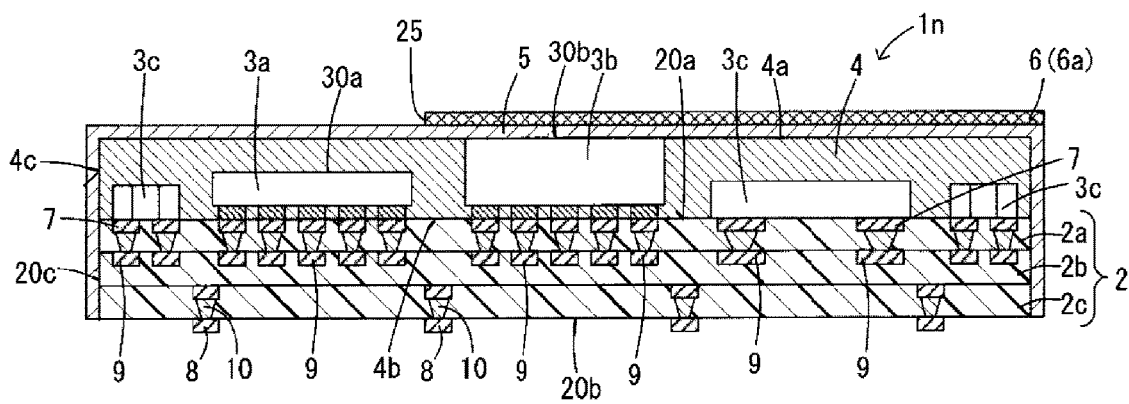
FIG. 17 illustrates a modification of the high-frequency module in FIG. 16.
Figure 18:
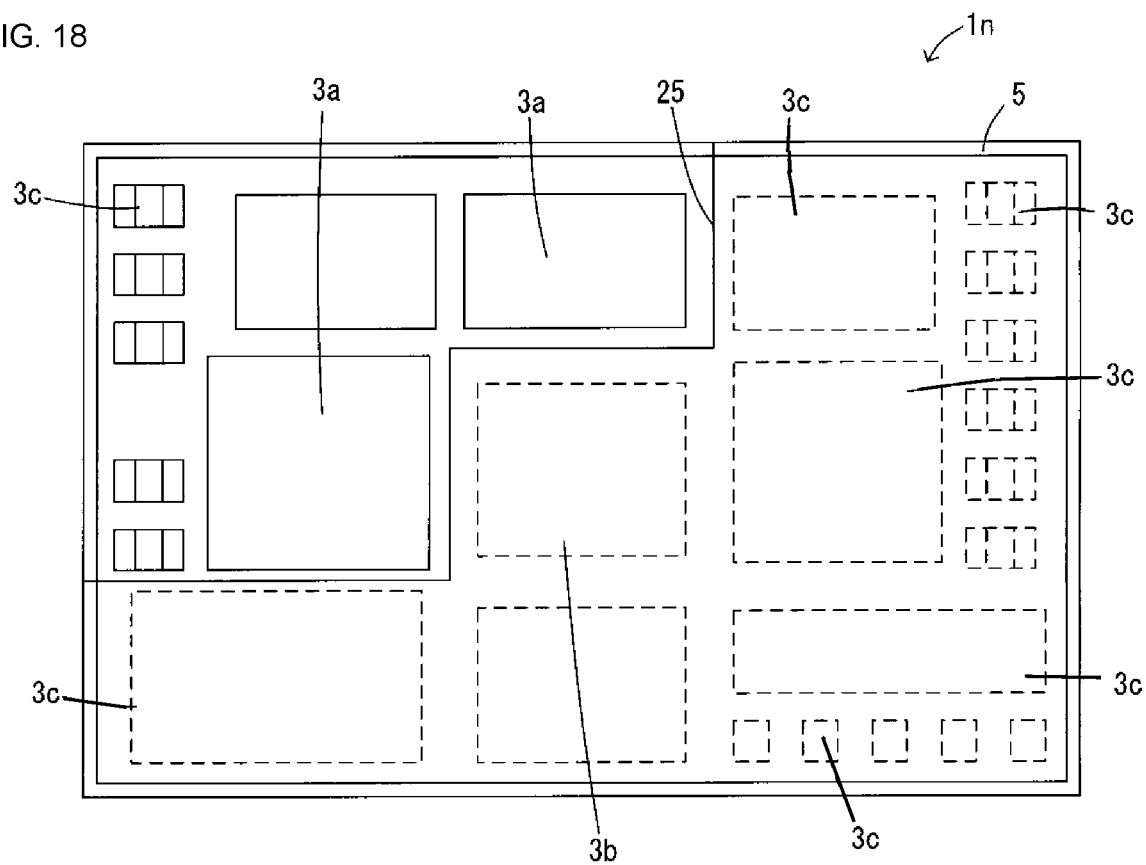
FIG. 18 illustrates the modification of the high-frequency module in FIG. 16.
Figure 19:
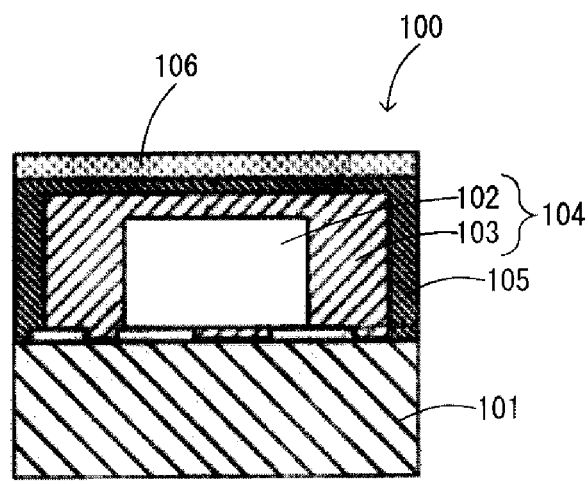
FIG. 19 is a sectional view of an existing high-frequency module.

As with a high-frequency module 1n illustrated in FIGS. 17 and 18, a configuration in which a cutout portion 25 is provided in the heat dissipation member 6 and the heat dissipation member 6 is not disposed in a region including the first component 3a as viewed in the direction perpendicular to the upper surface 20a of the circuit board 2 may be possible.

The present disclosure is not limited to each of the above-described embodiments, and, other than the above-described embodiments, various modifications can be made without departing from the scope and spirit of the disclosure. For example, it may be possible to combine the configurations of the above-described embodiments and modifications with one another.

In addition, the second component 3b is not necessarily exposed at the upper surface 4a of the sealing resin layer 4. The shield film 5 is not necessarily formed.

The present disclosure is applicable to various high-frequency modules including a shield.

1a to 1n high-frequency module
circuit board (circuit board)
20a upper surface (one main surface)
3a first component
3b second component
4 sealing resin layer
4a upper surface (opposite surface)
6 heat dissipation member
6c heat dissipation fin
11 recessed portion
13 first groove
14 second groove

The invention claimed is:
1. A high-frequency module comprising:
a circuit board;
a first component and a second component, the first component and the second component being mounted on one main surface of the circuit board;
a sealing resin layer having a contact surface in contact with the one main surface of the circuit board, an opposite surface opposing to the contact surface, and side surfaces connecting edges of the contact surface to respective edges of the opposite surface, the opposite surface having a recessed portion at least partly defining a hollow portion, the sealing resin layer being configured to seal the first component and the second component; and
a heat dissipation member disposed above the opposite surface of the sealing resin layer, wherein the hollow portion is disposed at a position overlapping the first component as viewed in a direction perpendicular to the one main surface of the circuit board.

2. The high-frequency module according to claim 1, wherein the opposite surface of the sealing resin layer further has a first groove deeper than the recessed portion, and wherein the first groove is provided between the first component and the second component and connected to the recessed portion.

3. The high-frequency module according to claim 2, wherein the recessed portion is comprised of a plurality of small depressions provided at a position overlapping the first component as viewed in the direction perpendicular to the one main surface of the circuit board.

4. The high-frequency module according to claim 2, wherein the recessed portion has a shape substantially the same as a shape of the first component as viewed in the direction perpendicular to the one main surface of the circuit board.

5. The high-frequency module according to claim 2, wherein the opposite surface of the sealing resin layer further has a vent groove, and the vent groove extends from the recessed portion to an end portion of the sealing resin layer as viewed in the direction perpendicular to the one main surface of the circuit board.

6. The high-frequency module according to claim 1, wherein the opposite surface of the sealing resin layer further has a second groove deeper than the recessed portion, and wherein the second groove surrounds the first component as viewed in the direction perpendicular to the one main surface of the circuit board and connected to the recessed portion.

7. The high-frequency module according to claim 6, wherein the recessed portion is comprised of a plurality of small depressions provided at a position overlapping the first component as viewed in the direction perpendicular to the one main surface of the circuit board.

8. The high-frequency module according to claim 6, wherein the recessed portion has a shape substantially the same as a shape of the first component as viewed in the direction perpendicular to the one main surface of the circuit board.

9. The high-frequency module according to claim 6, wherein the opposite surface of the sealing resin layer further has a vent groove, and the vent groove extends from the recessed portion to an end portion of the sealing resin layer as viewed in the direction perpendicular to the one main surface of the circuit board.

10. The high-frequency module according to claim 1, wherein the recessed portion is comprised of a plurality of small depressions provided at a position overlapping the first component as viewed in the direction perpendicular to the one main surface of the circuit board.

11. The high-frequency module according to claim 1, wherein the recessed portion has a shape substantially the same as a shape of the first component as viewed in the direction perpendicular to the one main surface of the circuit board.

12. The high-frequency module according to claim 1, wherein the opposite surface of the sealing resin layer further has a vent groove, and the vent groove extends from the recessed portion to an end portion of the sealing resin layer as viewed in the direction perpendicular to the one main surface of the circuit board.

13. The high-frequency module according to claim 1, wherein the second component has a height greater than a height of the first component from the one main surface of the circuit board and is exposed at the opposite surface of the sealing resin layer.

14. The high-frequency module according to claim 1, wherein a shield film configured to cover at least the opposite surface and the side surfaces of the sealing resin layer is provided.

15. A high-frequency module comprising:
a circuit board;
a first component and a second component, the first component and the second component being mounted on one main surface of the circuit board;
a sealing resin layer having a contact surface in contact with the one main surface of the circuit board, an opposite surface opposing to the contact surface, and side surfaces connecting edges of the contact surface to respective edges of the opposite surface, the sealing resin layer including a hollow portion, the sealing resin layer being configured to seal the first component and the second component; and a heat dissipation member disposed above the opposite surface of the sealing resin layer,
wherein the hollow portion has a height from a surface of the first component on an opposite side to a mounting surface of the first component to a position lower than the opposite surface of the sealing resin layer and disposed at a position overlapping the first component as viewed in a direction perpendicular to the one main surface of the circuit board.

16. The high-frequency module according to claim 15, wherein the hollow portion has a shape substantially the same as a shape of the first component as viewed in the direction perpendicular to the one main surface of the circuit board.

17. A high-frequency module comprising:
a circuit board;
a first component and a second component, the first component and the second component being mounted on one main surface of the circuit board;
a sealing resin layer having a contact surface in contact with the one main surface of the circuit board, an opposite surface opposing to the contact surface, and side surfaces connecting edges of the contact surface to respective edges of the opposite surface, the sealing resin layer being configured to seal the first component and the second component; and
a heat dissipation member having a facing surface facing the sealing resin layer, the facing surface having a recessed portion at least partly defining a hollow portion,
wherein the hollow portion is disposed at a position overlapping the first component as viewed in a direction perpendicular to the one main surface of the circuit board.

18. The high-frequency module according to claim 17, wherein the recessed portion has a shape substantially the same as a shape of the first component as viewed in the direction perpendicular to the one main surface of the circuit board.

19. The high-frequency module according to claim 17, wherein a heat dissipation fin is provided on a surface of the heat dissipation member opposite to the facing surface of the heat dissipation member and has a recessed portion that is opposite to the recessed portion of the facing surface and that at least partly defines the hollow portion.

20. The high-frequency module according to claim 17, further comprising:
   a groove provided in the opposite surface of the sealing resin layer,
   wherein the groove surrounds the first component as viewed in the direction perpendicular to the one main surface of the circuit board.

\* \* \* \* \*

UNITED STATES PATENT AND TRADEMARK OFFICE
CERTIFICATE OF CORRECTION

PATENT NO. : 11,302,606 B2
APPLICATION NO. : 16/999172
DATED : April 12, 2022
INVENTOR(S) : Yoshihito Otsubo et al.

It is certified that error appears in the above-identified patent and that said Letters Patent is hereby corrected as shown below:

In the Specification

Column 8, Line 20, "if" should be -- 1f --.

Column 8, Line 24, "if" should be -- 1f --.

Column 10, Line 38, "circuit board (circuit board)" should be -- 2 circuit board (circuit board) --.

Signed and Sealed this
Thirty-first Day of January, 2023

Katherine Kelly Vidal
*Director of the United States Patent and Trademark Office*